United States Patent
Perino et al.

[11] Patent Number: 5,990,513
[45] Date of Patent: Nov. 23, 1999

[54] YIELD ENHANCEMENT TECHNIQUE FOR INTEGRATED CIRCUIT PROCESSING TO REDUCE EFFECTS OF UNDESIRED DIELECTRIC MOISTURE RETENTION AND SUBSEQUENT HYDROGEN OUT-DIFFUSION

[75] Inventors: Stanley C. Perino, Ft. Collins; Sanjay Mitra, Colorado Springs; George Argos, Jr., Colorado Springs; Holli Harper, Colorado Springs, all of Colo.

[73] Assignee: Ramtron International Corporation, Colorado Springs, Colo.

[21] Appl. No.: 08/728,256

[22] Filed: Oct. 8, 1996

[51] Int. Cl.$^6$ ................................................. H01L 29/788
[52] U.S. Cl. .......................... 257/315; 257/316; 257/760
[58] Field of Search .................................. 257/295, 316, 257/327, 529, 315, 760

[56] References Cited

U.S. PATENT DOCUMENTS

| | | |
|---|---|---|
| 4,873,644 | 10/1989 | Eaton, Jr. . |
| 4,873,664 | 10/1989 | Eaton, Jr. . |
| 4,888,733 | 12/1989 | Mobley . |
| 4,914,627 | 4/1990 | Eaton, Jr. et al. . |
| 5,139,971 | 8/1992 | Giridhar et al. . |
| 5,231,058 | 7/1993 | Maeda et al. . |
| 5,286,681 | 2/1994 | Maeda et al. . |
| 5,376,590 | 12/1994 | Machida et al. . |
| 5,381,364 | 1/1995 | Chern et al. . |
| 5,438,023 | 8/1995 | Argos, Jr. et al. . |
| 5,459,353 | 10/1995 | Kanazawa . |
| 5,495,439 | 2/1996 | Morihara . |
| 5,525,528 | 6/1996 | Perino et al. . |
| 5,530,668 | 6/1996 | Chern et al. . |
| 5,532,953 | 7/1996 | Ruesch et al. . |
| 5,559,052 | 9/1996 | Lee et al. . |
| 5,624,864 | 4/1997 | Arita et al. . |
| 5,801,415 | 9/1998 | Lee et al. ................................ 257/316 |

FOREIGN PATENT DOCUMENTS 0 485 086 A1  5/1992  European Pat. Off. .

OTHER PUBLICATIONS

IBM Technical Disclosure Bulletin, Low Charging Conformal Phosphorous Silicon Glass Passivation Process, Jun. 6, 1995, p. 637.

*Primary Examiner*—Teresa M. Arroyo
*Assistant Examiner*—Roy Potter
*Attorney, Agent, or Firm*—William J. Kubida, Esq.; Holland & Hart LLP

[57] ABSTRACT

A yield enhancement technique for integrated circuit processing which reduces the deleterious effects of $H_2O$ contamination which is absorbed by conventional dielectric films resulting in an undesired subsequent out-diffusion of hydrogen when the integrated circuit die is subsequently subjected to relatively high processing temperatures such as those experienced in CERDIP packaging. The technique disclosed comprises the formation of an interlevel dielectric layer having hydrophilic properties (for example, 7.5% phosphorus doped TEOS) at least partially surrounding a device on the integrated circuit which layer is then subjected to an annealing operation to drive off at least a portion of any moisture present therein. A second relatively less hydrophilic dielectric layer (such as UTEOS) is then overlaid in at least partial communication with the interlevel dielectric layer and an overlying passivation layer (such as UTEOS) is then applied to the integrated circuit prior to completion of the integrated circuit processing and subsequent packaging operations.

20 Claims, 3 Drawing Sheets

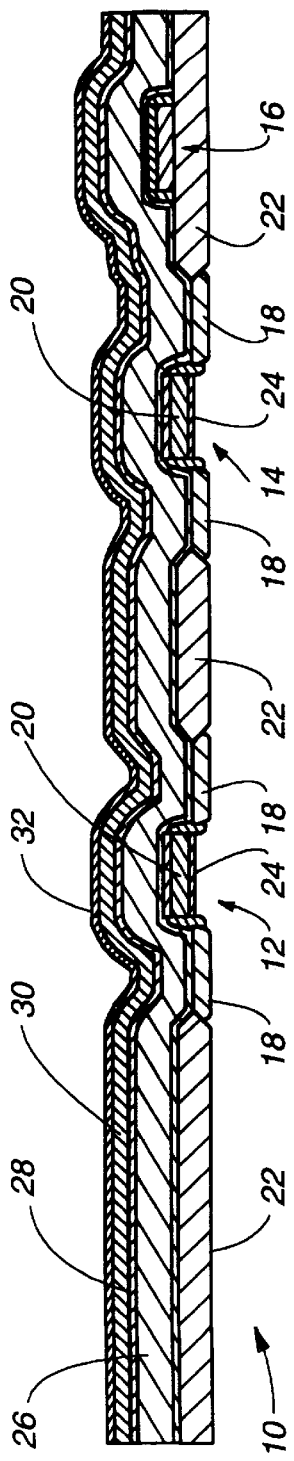
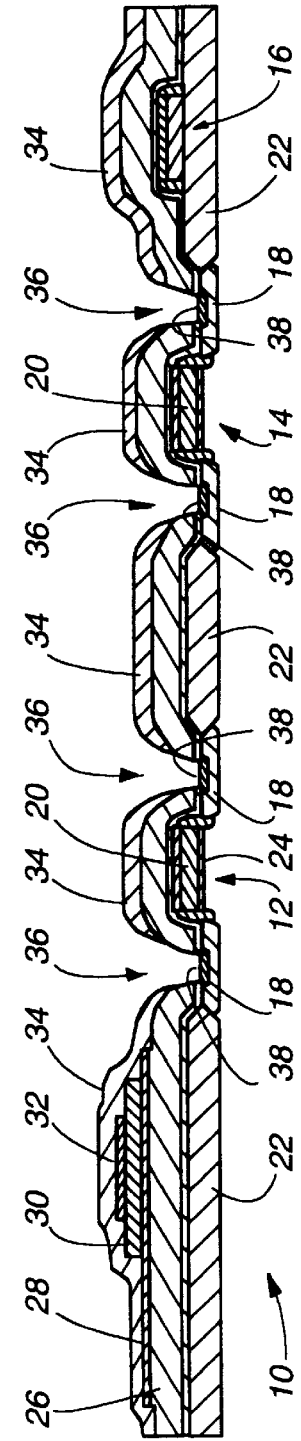
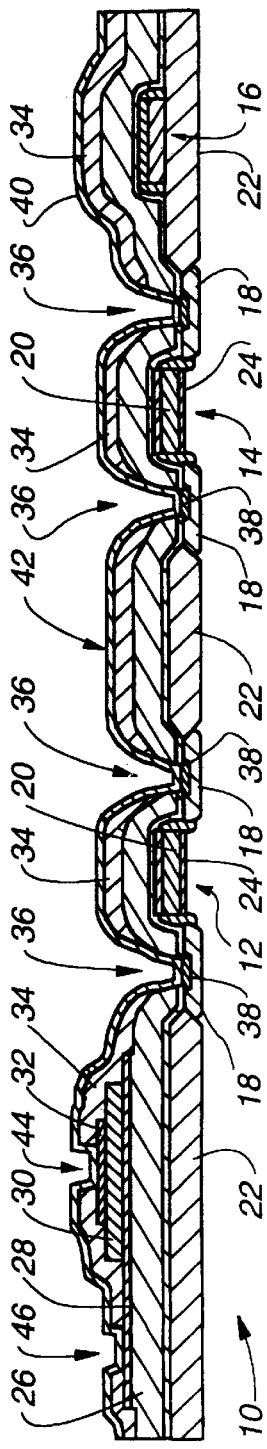

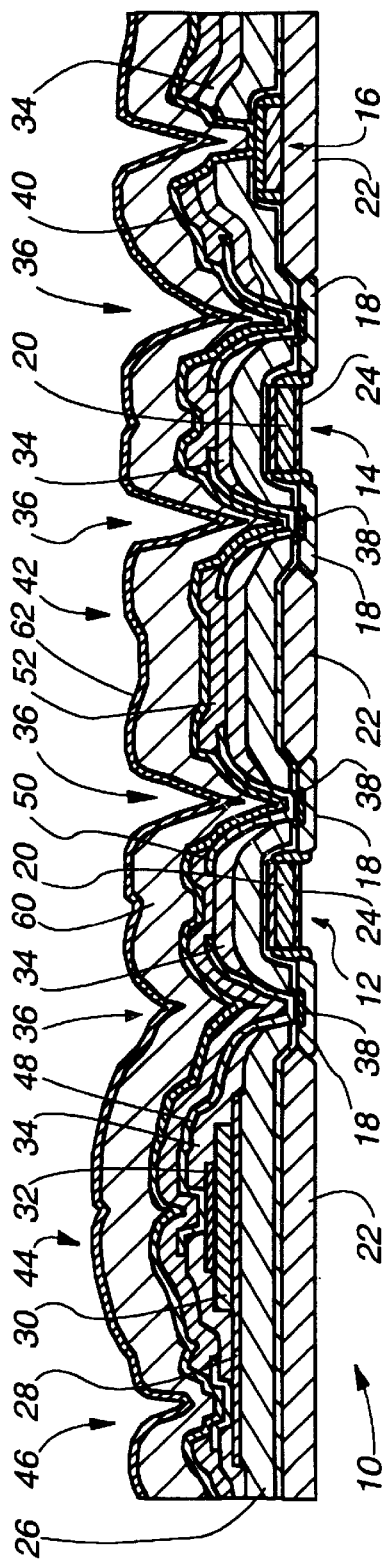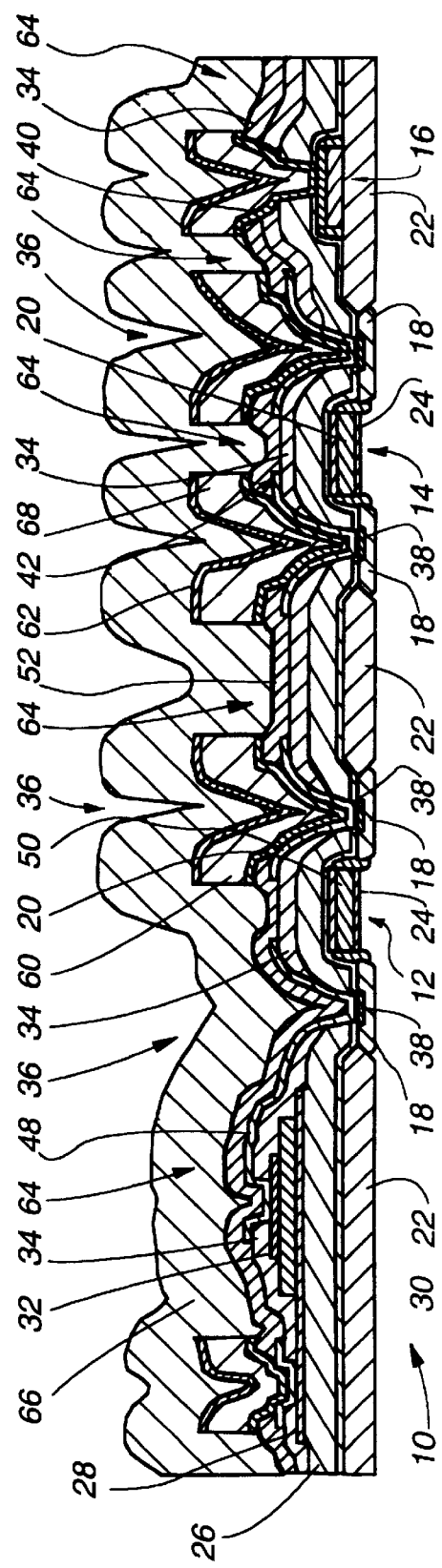

YIELD ENHANCEMENT TECHNIQUE FOR INTEGRATED CIRCUIT PROCESSING TO REDUCE EFFECTS OF UNDESIRED DIELECTRIC MOISTURE RETENTION AND SUBSEQUENT HYDROGEN OUT-DIFFUSION

BACKGROUND OF THE INVENTION

The present invention relates, in general, to the field of integrated circuit processing techniques. More particularly, the present invention relates to a yield enhancement technique of particular utility with respect to the fabrication, processing and packaging of ceramic dual in-line package ("CERDIP") integrated circuit devices including semiconductor memories such as ferroelectric random access memory devices exemplified by the FRAM® family of integrated circuit devices available from Ramtron International Corporation, Colorado Springs, Colo., assignee of the present invention.

The absorption of moisture ($H_2O$) into certain chemical vapor deposition ("CVD") deposited silicon dioxide ($SiO_2$) and glass film dielectrics is a well known phenomenon with the presence of the $H_2O$ content being reasonably deduced by analysis of the stress vs. temperature characteristics of the films. When subjected to temperatures above 200° Celsius ("C") in subsequent wafer processing, the $H_2O$ contamination is also known to diffuse out of the dielectric films and react with adjacent metals such as aluminum (Al) and titanium nitride (TiN) to form a metal oxide with a reaction byproduct of hydrogen (i.e. $3H_2O+2Al=Al_2O_3+3H_2$). This absorption and subsequent release of moisture is also known to cause instability problems for standard MOS and CMOS semiconductor and integrated circuit devices through aluminum corrosion, contact "poisoning", undesirable "hot carrier" effects, increased leakage currents, threshold voltage ("Vt") shifts, increased metal resistivity and the like. The destructive effects of $H_2$ on switching performance of ferroelectric integrated circuit memory devices is also known.

Ferroelectric memory devices, such as the FRAM® family of integrated circuit devices, provide nonvolatile data storage through the use of a ferroelectric dielectric material which may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage ("V") and resulting polarization ("Q") states respectively, may be plotted to represent the response of the polarization of a ferroelectric capacitor to the applied voltage. A more complete description of this characteristic hysteresis curve is disclosed, for example, in U.S. Pat. Nos. 4,914,627 and 4,888,733 assigned to the assignee of the present invention, the disclosures of which are herein specifically incorporated by this reference.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and produce either a logic "1" or "0" at the IC output pins provided that Q is sufficiently large. In a conventional two transistor/two capacitor ("2T/2C") ferroelectric memory cell, a pair of two data storage elements are utilized, each polarized in opposite directions. To "read" the state of a 2T/2C memory cell, both elements are polarized in the same direction and the sense amps measure the difference between the amount of charge transferred from the cells to a pair of complementary bit lines. In either case, since a "read" to a ferroelectric memory is a destructive operation, the correct data is then restored to the cell.

Ferroelectric memory cell structures are disclosed in the following U.S. Pat. Nos. 4,873,664 issued Oct. 10, 1989 for "Self-Restoring Ferroelectric Memory"; 5,381,364 issued Jan. 10, 1995 for "Ferroelectric-Based RAM Sensing Scheme Including Bit-Line Capacitance Isolation"; 5,525,528 issued Jun. 11, 1996 for "Ferroelectric Capacitor Renewal Method"; 5,530,668 issued Jun. 25, 1996 for "Ferroelectric Memory Sensing Scheme Using Bit Lines Precharged to a Logic One Voltage" and 5,532,953 issued Jul. 2, 1996 for "Ferroelectric Memory Sensing Method Using Distinct Read and Write Voltages", all assigned to Ramtron International Corporation, Colorado Springs, Colo., assignee of the present invention, the disclosures of which are herein specifically incorporated by this reference.

In a simple "write" operation, an electric field is applied to the cell capacitor to polarize it to the desired state. Briefly, the conventional write mechanism for a 2T/2C memory cell includes inverting the dipoles on one cell capacitor and holding the electrode, or plate, to a positive potential greater than the coercive voltage for a nominal 100 nanosecond ("nsec.") time period. The electrode is then brought back to circuit ground for the other cell capacitor to be written for an additional nominal 100 nsec. In any event, the switching polarization ("$Q_{sw}$") of the device must be sufficiently large for the signal presented to the sense amplifiers to be accurately read and the performance of the device is severely degraded should $Q_{sw}$ be too low for reliable operation.

As previously stated, ferroelectric random access memory devices are known to be especially sensitive to the aforedescribed out-diffusion of hydrogen and it is believed that this may exacerbate, at least in part, the relatively poor adhesion characteristics exhibited at the interface between platinum (Pt) and certain ferroelectric dielectrics such as Ramtron International Corporation's proprietary lead zirconate titanate ("PZT") films. This mechanism is currently believed to be the cause of an observed Qsw switching degradation, particularly following CERDIP packaging or other packaging or processing steps requiring a 440° Celsius annealing step. In some cases, yields of little more than 0% have been encountered which is believed to be most probably due to the outgassing of moisture and/or hydrogen.

SUMMARY OF THE INVENTION

A yield enhancement technique for integrated circuit processing is disclosed herein which reduces the deleterious effects of any moisture contamination which might be absorbed by conventional dielectric films and thereafter result in an undesired out-diffusion of hydrogen when the integrated circuit die is subsequently subjected to relatively high processing temperatures such as those experienced in CERDIP packaging. The technique disclosed comprises the formation of an interlevel dielectric layer having hydrophilic (or moisture absorbing) properties (for example, $SiO_2$ deposited using 7.5% phosphorus doped tetraethyloxysilicate "PTEOS") at least partially surrounding a device on the integrated circuit which layer is then subjected to an annealing operation to drive off at least a portion of any moisture present therein. A second relatively less hydrophilic dielectric layer (such as SiO$_2$ deposited using undoped tetraethyloxysilicate ("UTEOS") is then overlaid in at least partial communication with the interlevel dielectric layer and an overlying passivation layer (such as UTEOS) is then applied to the integrated circuit prior to completion of the integrated circuit processing and subsequent packaging operations.

As presently understood, the annealed hydrophilic layer functions as a "getter" for out-diffusion from subsequent unannealed dielectric layers and the higher the phosphorus content of the hydrophilic layer, the higher its saturation for moisture. The subsequent relatively less hydrophilic dielectric and passivation layers may be formed of UTEOS, (which are not annealed) and will retain much less moisture than PTEOS films.

Particularly disclosed herein is a method for yield enhancement in an integrated circuit fabrication process which comprises the steps of providing a relatively contamination absorbent first layer at least partially surrounding one element of the integrated circuit and subjecting the integrated circuit, including the first layer, to a temperature sufficient to drive off at least a portion of any contaminants absorbed thereby. The method further comprises the steps of further providing a relatively less contamination absorbent second layer in at least partial communication with the first layer and passivating the integrated circuit, including the first and second layers, wherein any of the contaminants present in the second layer are at least partially absorbed by the first layer.

In a particular implementation of the method disclosed herein, the first layer may comprise a relatively hydrophilic insulating layer such as an interlevel dielectric comprising, for example, silicon dioxide, silicon nitride (Si$_3$N$_4$) or a ferroelectric layer such as PZT. In a preferred embodiment of the yield enhancement technique herein disclosed, the interlevel dielectric may be doped with between approximately 5%–10% phosphorus and is preferably substantially 7.5% phosphorus.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1A is a partial, side elevational, cut-away, cross-sectional view of a two transistor/two capacitor ("2T/2C") ferroelectric integrated circuit memory cell illustrating a representative process flow implementing the yield enhancement technique of the present invention on a conventional CMOS underlayer and showing the memory cell and associated structure following implementation of the ferroelectric capacitor bottom electrode, ferroelectric dielectric and top electrode deposition steps;

FIG. 1B is a follow-on illustration of the memory cell structure of FIG. 1A following photolithographic operations to define the ferroelectric capacitor structure of the memory cell and the deposition and subsequent photolithographic operations to form a ferroelectric oxide ("FEO glass") layer;

FIG. 1C is an additional, follow-on illustration of the memory cell structure of FIG. 1B following an additional photolithographic operation to define the top and bottom electrode contacts to the ferroelectric capacitors of the memory device followed by a recovery annealing operation and the deposition of a titanium nitride layer to form electrical contacts to the top and bottom electrodes of the capacitor and local interconnect conductors;

FIG. 1F is a further, follow-on illustration of the memory cell structure of FIG. 1E following the implementation of titanium nitride deposition and oxidation steps and the formation of an aluminum silicon copper deposition and titanium nitride cap layers; and FIG. 1G is a final, follow-on illustration of the memory cell structure of FIG. 1F following a subsequent photolithographic operation on selected portions of the titanium nitride, aluminum silicon copper and titanium nitride cap layers and the deposition of an overlying passivation layer wherein the memory cell structure is then in a condition for the photolithographic placement of bonding pads.

DESCRIPTION OF A PREFERRED EMBODIMENT

Figure 1D:
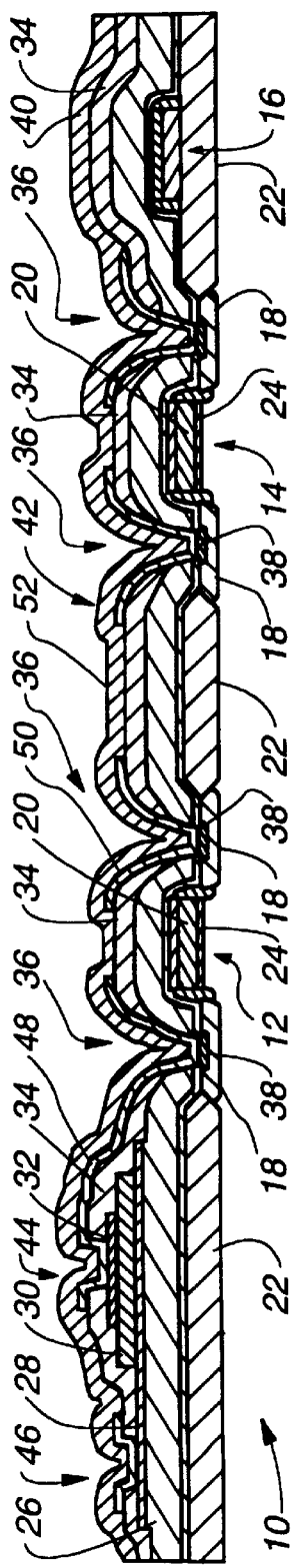
FIG. 1D is a further, follow-on illustration of the memory cell structure of FIG. 1C following a further photolithographic operation on selected portions of the titanium nitride layer and the deposition of a local interconnect oxide ("LIO glass") layer.

The exemplary process flow shown and described hereinafter is one which may be utilized to form, for purposes of example only, a conventional 2T/2C memory cell forming a portion of a larger memory array of a ferroelectric integrated circuit memory device comprising a plurality of such memory cells. In a conventional 2T/2C cell, complimentary pairs of transistors and ferroelectric capacitors are utilized and each portion of the cell comprises a pass transistor having one terminal thereof connected to a bit line ("BL") or ("BL\") and another terminal thereof connected to one terminal of a ferroelectric capacitor respectively. The gate terminals of the respective pass transistors are connected to a word line ("WL") and the other terminal of the ferroelectric capacitors are connected to a plate line ("PL") .

With reference specifically now to FIG. 1A, an initial view of a possible process flow for producing an FRAM® memory device in accordance with the technique of the present invention is shown, wherein a portion of an integrated circuit 10 utilizing the yield enhancement technique disclosed herein is shown. The integrated circuit 10 includes a pair of pass transistors 12 and 14 as well as a polysilicide conductor 16. Each of the transistors 12, 14 include source/drain regions 18 and intermediate and overlying gates 20. Field oxide regions 22 separate the transistors 12 and 14 as well as underlie the conductor 16. Gate oxide 24 underlies the gates 20 of the transistors 12, 14. In a particular embodiment, the aforementioned structure may be completed in a standard complementary metal-oxide semiconductor ("CMOS") process.

Overlying the aforementioned structure is a densified/reflowed boron-phosphorus-silicon glass ("BPSG") layer 26 which is then subject to an etchback operation to remove approximately 2,000 angstroms ("Å") of the BPSG layer 26. At this point, the integrated circuit 10 is subjected to a dehydration bake operation to serve to remove possible water contamination from the existing integrated circuit 10 layers. Thereafter, a bottom electrode ("BE") layer 28 of titanium ("Ti")/platinum ("Pt") is deposited overlying the BPSG layer 26. The BE layer 28 may comprise approximately 200 Å Ti and 1,750 Å Pt. At this point, a ferroelectric dielectric layer 30 is deposited which may comprise, for example, lead zirconate titanate ("PZT"), such as the proprietary ceramic thin films developed by Ramtron International Corporation, assignee of the present invention, or other suitable ferroelectric dielectric material. When utilizing PZT dielectric material, approximately 3,000 Å may be deposited to form the ferroelectric layer 30.

At this point, a first annealing operation (rapid thermal anneal "RTA") is conducted and may comprise a two-step process of a bake at 650° celsius ("C") for five seconds in an atmosphere of oxygen ("$O_2$") followed by a second bake at 850° C. for five seconds in an $O_2$ atmosphere. Other annealing techniques may also be utilized instead of an RTA operation. Following the first annealing operation, the top electrode ("TE") layer 32 is deposited which comprises, in a preferred embodiment, approximately 1,750 Å of Pt.

With reference additionally now to FIG. 1B, the integrated circuit 10 of FIG. 1A is shown after undergoing subsequent processing steps as will be more fully described hereinafter. The integrated circuit 10 is first subject to a top electrode photolithographic operation to remove selected portions of the structure shown in the preceding figure, followed by a top electrode etching and cleaning step. Thereafter, a second annealing operation is conducted and a subsequent ferroelectric photolithographic operation is performed to define the capacitor structure followed by a PZT etch and clean operation. At this point, the bottom electrode photolithographic operation is conducted to define the lower plate of the capacitor followed by a subsequent bottom electrode etching and cleaning step.

Following these steps, a ferroelectric oxide ("FEO") glass deposition step is performed resulting in a deposition of substantially between 2,000–5,000 Å (and preferably approximately 3,000 Å) of FEO glass 34. In a particular embodiment, the FEO glass 34 may comprise between 5%–10% of phosphorus doped tetraethyloxysilicate ("PTEOS") with a preferred value of substantially 7.5% phosphorous doped TEOS. The deposition of the FEO glass 34 is followed by a first recovery annealing operation at substantially 550° C. for 1 hour in an atmosphere of $O_2$. The recovery annealing operation serves to remove at least a portion of any moisture that may have been previously absorbed by the relatively more hydrophilic PTEOS glass. Thereafter, an active contact window ("ACW") photolithographic operation is performed. An active contact etch and cleaning step thereafter results in the formation of contact openings 36 followed by an active contact silicidation step and the formation of ACW contacts 38 with the silicide.

With reference additionally now to FIG. 1C, the integrated circuit 10 of the preceding figures is shown following its subjection to subsequent processing steps as will be more fully described hereinafter. In this regard, the integrated circuit 10 undergoes a top and bottom electrode contact ("TEC") photolithographic operation to establish electrical connections through selected portions of the FEO glass 34, followed by a TEC contact etch and cleaning step. The integrated circuit 10 is then subjected to a recovery annealing operation followed by a local interconnect deposition of approximately 800 Å of titanium nitride ("TiN"). These steps result in the laying down of an interconnect layer 40 which comprises local interconnect conductor 42 as well as top electrode contacts 44 and bottom electrode contacts 46.

With reference additionally now to FIG. 1D, the integrated circuit 10 is shown following additional subsequent processing steps as will be more fully described hereinafter. As shown, the interconnect layer 40 comprising local interconnect conductor 42 undergoes a local interconnect ("LI") photolithographic step to remove selected portions thereof. Following the local interconnect photolithography step, a local interconnect etching and cleaning operation is performed. These operations result in the formation of an LI strap 48 in the area of the top electrode contact as well as an LI pad in contact with the ACW contact 38 with the silicide. Thereafter, a local interconnect oxide deposition of approximately between 2,000–5,000 Å (and preferably 3,500 Å) of LIO glass 52 is deposited overlying the LI strap 48 and LI pad 50. In a preferred embodiment, the LIO glass 52 may comprise undoped tetraethyloxysilicate ("UTEOS").

Figure 1E:
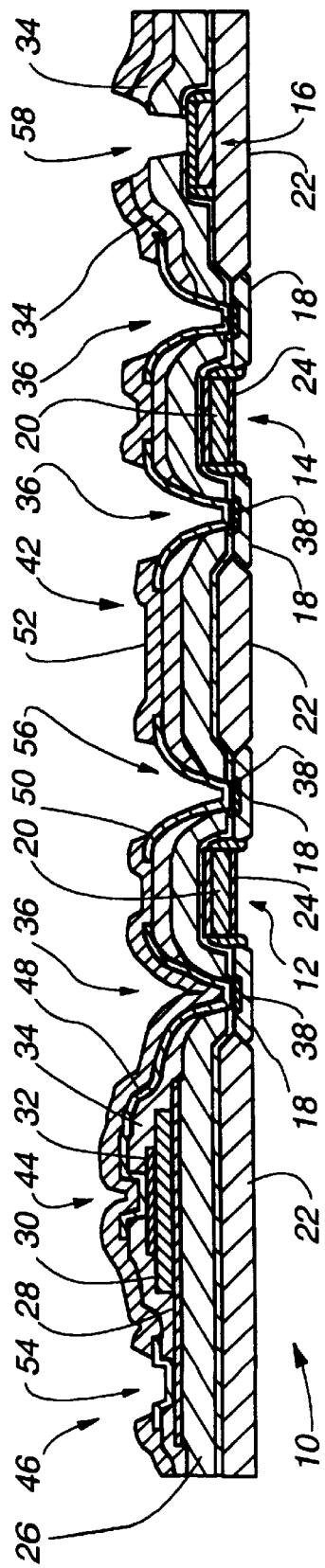
FIG. 1E is an additional, follow-on illustration of the memory cell structure of FIG. 1D following an additional photolithographic operation on selected portions of the local interconnect oxide layer to form a number of contact holes through the LIO layer to provide subsequent electrical contact to various of the memory cell elements.

With reference additionally now to FIG. 1E, the integrated circuit 10 is again shown following subsequent processing steps as will be more fully described hereinafter. As shown, the integrated circuit 10 is then subjected to a contact photolithography step followed by a contact etching and cleaning step to result in the formation of a contact hole in the LIO glass 52 to contact the bottom electrode 54, a contact to ACW 56 (stopping on the LI pad) and a contact to the polycide 58.

With reference additionally now to FIG. 1F, the integrated circuit 10 of the preceding figures is shown following additional subsequent processing steps as will be more fully described hereinafter. In this regard, the integrated circuit 10 is subject to a TiN barrier deposition process wherein approximately 1,500 Å of TiN is deposited. Thereafter, a TiN barrier oxidation ("RTA") step is undertaken. Following the TiN barrier oxidation step, a deposition of approximately 8,000 Å of aluminum (approximately 98.5%) silicon (approximately 1%) copper (approximately 0.5%) ("AlSiCu") is undertaken to result in a layer of AlSiCu 60. A subsequent TiN cap deposition step wherein approximately 300 Å of TiN is deposited to form a TiN cap 62 on the AlSiCu 60 may then be performed.

With additional reference now to FIG. 1G, the integrated circuit 10 of the present invention is shown following a final metallization photolithography and metallization etch and cleaning steps wherein a number of regions 64 are formed by removal of selected portions of the TiN barrier layer, the AlSiCu 60 and overlying TiN cap 62. A passivation deposition is then performed which, in a preferred embodiment, may comprise formation of a passivation layer 66 of approximately 7000 Å of UTEOS.

The apparent sensitivity of ferroelectric capacitors and devices in particular to moisture/hydrogen out-diffusion resulted in their evaluation by subjecting various product wafers to simulated CERDIP bakes including a first baking operation of 10 minutes at 440° C. in an atmosphere of $N_2$ and a second baking operation of 1 hour at 440° C. in an atmosphere of $N_2$. Experimentally, the following combination of films was shown to produce the minimum amount of $Q_{sw}$ loss: FEO glass 34 (7.5% phosphorous doped TEOS); LIO glass 52 (UTEOS) and passivation layer 66 (7000 Å UTEOS).

As presently understood, experiments tend to show that the FEO glass 34 functions as a hydrogen/moisture trap and thus, as a diffusion barrier. As previously described, this relatively hydrophilic film is annealed at 550° Celsius for 1 hour in an atmosphere of $O_2$ and is, therefore, relatively moisture deficient. It then functions as a "getter" for out-diffusion from subsequent unannealed oxides or glass dielectric layers. The higher the phosphorus content, the higher the saturation for moisture. Also, the LIO glass 52 and passivation layer 66 films are not annealed (that is, not subjected to temperatures higher than 440° C.) due to the particular requirements of the exemplary process flow. UTEOS (or undoped) films will retain much less moisture than PTEOS films.

Although disclosed and hereinbefore described with particular reference to the fabrication of a ferroelectric integrated circuit 2T/2C memory cell, the yield enhancement technique provided herein may also be utilized in the construction of a ferroelectric integrated circuit 1T/1C memory cell wherein the memory cell structure is similar to that of a standard dynamic random access memory ("DRAM") cell utilizing only a single pass transistor coupled to a single ferroelectric capacitor. The ferroelectric memory cell differs from that of a conventional volatile DRAM in the provision of a third active line at the capacitor plate and instead of a complementary cell structure like the 2T/2C shown, a single bit line is coupled to one terminal of the transistor and the word line is coupled to the transistor gate. When reading the contents of a 1T/1C cell, the capacitor is polarized and the charge transferred is compared to a reference cell or other fixed level and the result of this comparison determines whether a logic "one" or "zero" was stored in the cell.

While there have been described above the principles of the present invention in conjunction with specific semiconductor integrated circuit memories and processing technologies, it is to be clearly understood that the foregoing description is made only by way of example and not as a limitation to the scope of the invention. For example, the principles of the present invention are likewise applicable to other integrated circuit technologies and devices other than those utilizing ferroelectric elements or memory cells including conventional bipolar, MOS (such as NMOS, CMOS and the like) and other technologies wherein moisture contamination and/or hydrogen out-diffusion is a potential problem. Moreover, although particularly applicable to integrated circuit processing utilizing CERDIP packaging, the principles of the present invention are likewise applicable to plastic encapsulation and other packaging techniques wherein moisture and/or hydrogen out-diffusion is a potential problem.

The various dielectric and passivation layers previously described, although shown as comprising $SiO_2$ in the exemplary process flow illustrated, may also be provided utilizing ferroelectric dielectrics such as PZT. Ferroelectric passivation and interlevel dielectric techniques are disclosed in U.S. Pat. No. 5,438,023 issued Aug. 1, 1995 for "Passivation Method and Structure for a Ferroelectric Integrated Circuit Using Hard Ceramic Materials or the Like" and U.S. patent application Ser. No. 08/700,076 filed Aug. 20, 1996 for "Partially or Completely Encapsulated Top Electrode of a Ferroelectric Capacitor", both assigned to Ramtron International Corporation, the disclosures of which are specifically incorporated herein by this reference.

Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit including a plurality of devices monolithically integrated thereon, said integrated circuit comprising:

an interlevel dielectric layer at least partially surrounding one of said plurality of devices, said interlevel dielectric layer being formed of a relatively hydrophilic material subjected to a temperature sufficient to drive off at least a portion of any moisture absorbed therein, wherein said interlevel dielectric layer comprises substantially between 5%–10% phosphorus doped TEOS;

another dielectric layer in at least partial moisture communication with said interlevel dielectric layer; and a passivation layer overlying said integrated circuit including said interlevel dielectric and said another dielectric layers, whereby at least a portion of said moisture which might be present in said another dielectric layer is communicated to and retained by said interlevel dielectric layer.

2. The integrated circuit of claim 1 wherein said interlevel dielectric layer comprises substantially 7.5% phosphorus doped TEOS.

3. An integrated circuit including a plurality of devices monolithically integrated thereon, said integrated circuit comprising:

an interlevel dielectric layer at least partially surrounding one of said plurality of devices, said interlevel dielectric layer being formed of a relatively hydrophilic material subjected to a temperature sufficient to drive off at least a portion of any moisture absorbed therein, wherein said interlevel dielectric layer is substantially between 2,000–5,000 Å in thickness;

another dielectric layer in at least partial moisture communication with said interlevel dielectric layer; and a passivation layer overlying said integrated circuit including said interlevel dielectric and said another dielectric layers, whereby at least a portion of said moisture which might be present in said another dielectric layer is communicated to and retained by said interlevel dielectric layer.

4. The integrated circuit of claim 3 wherein said interlevel dielectric layer is substantially 3,000 Å in thickness.

5. An integrated circuit including a plurality of devices monolithically integrated thereon, said integrated circuit comprising:

an interlevel dielectric layer at least partially surrounding one of said plurality of devices, said interlevel dielectric layer being formed of a relatively hydrophilic material subjected to a temperature sufficient to drive off at least a portion of any moisture absorbed therein, wherein said interlevel dielectric layer comprises PZT;

another dielectric layer in at least partial moisture communication with said interlevel dielectric layer; and a passivation layer overlying said integrated circuit including said interlevel dielectric and said another dielectric layers, whereby at least a portion of said moisture which might be present in said another dielectric layer is communicated to and retained by said interlevel dielectric layer.

6. An integrated circuit including a plurality of devices monolithically integrated thereon, said integrated circuit comprising:

an interlevel dielectric layer at least partially surrounding one of said plurality of devices, said interlevel dielectric layer being formed of a relatively hydrophilic material subjected to a temperature sufficient to drive off at least a portion of any moisture absorbed therein;

another dielectric layer in at least partial moisture communication with said interlevel dielectric layer, wherein said another dielectric layer comprises PZT; and a passivation layer overlying said integrated circuit including said interlevel dielectric and said another dielectric layers, whereby at least a portion of said moisture which might be present in said another dielectric layer is communicated to and retained by said interlevel dielectric layer.

7. An integrated circuit including a plurality of devices monolithically integrated thereon, said integrated circuit comprising:

an interlevel dielectric layer at least partially surrounding one of said plurality of devices, said interlevel dielectric layer being formed of a relatively hydrophilic material subjected to a temperature sufficient to drive off at least a portion of any moisture absorbed therein;

another dielectric layer in at least partial moisture communication with said interlevel dielectric layer; and a passivation layer overlying said integrated circuit including said interlevel dielectric and said another dielectric layers, whereby at least a portion of said moisture which might be present in said another dielectric layer is communicated to and retained by said interlevel dielectric layer, wherein said passivation layer comprises UTEOS.

8. The integrated circuit of claim 7 wherein said passivation layer is substantially 7,000 Å in thickness.

9. An integrated circuit including a plurality of devices monolithically integrated thereon, said integrated circuit comprising:

an interlevel dielectric layer at least partially surrounding one of said plurality of devices, said interlevel dielectric layer being formed of a relatively hydrophilic material subjected to a temperature sufficient to drive off at least a portion of any moisture absorbed therein;

another dielectric layer in at least partial moisture communication with said interlevel dielectric layer; and a passivation layer overlying said integrated circuit including said interlevel dielectric and said another dielectric layers, whereby at least a portion of said moisture which might be present in said another dielectric layer is communicated to and retained by said interlevel dielectric layer, wherein said passivation layer comprises PZT.

10. A ferroelectric memory device including a plurality of memory cells having at least one pass transistor and at least one associated ferroelectric capacitor for storing a value indicative of a given logic level therein, said memory device comprising:

a first dielectric layer overlying said at least one pass transistor and said at least one associated ferroelectric capacitor, said first dielectric layer comprising a relatively hydrophilic material subjected to a temperature sufficient to drive off at least a portion of any moisture absorbed therein;

a conductive layer interconnecting said at least one pass transistor and said at least one associated ferroelectric capacitor;

a second dielectric layer overlying said conductive layer and said first dielectric layer, said second dielectric layer comprising a relatively lesser hydrophilic material than said first dielectric layer; and a passivation layer overlying said second dielectric layer.

11. The ferroelectric memory device of claim 10 wherein said first dielectric layer comprises substantially between 5%–10% phosphorus doped TEOS.

12. The ferroelectric memory device of claim 11 wherein said first dielectric layer comprises substantially 7.5% phosphorus doped TEOS.

13. The ferroelectric memory device of claim 10 wherein said first dielectric layer is substantially between 2,000–5,000 Å in thickness.

14. The ferroelectric memory device of claim 13 wherein said first dielectric layer is substantially 3,000 Å in thickness.

15. The ferroelectric memory device of claim 10 wherein said second dielectric layer comprises UTEOS.

16. The ferroelectric memory device of claim 10 wherein said second dielectric layer is substantially between 2,000–5,000 Å in thickness.

17. The ferroelectric memory device of claim 11 wherein said second dielectric layer is substantially 3,500 Å in thickness.

18. The ferroelectric memory device of claim 10 wherein said conductive layer comprises titanium nitride.

19. The ferroelectric memory device of claim 10 wherein said passivation layer comprises UTEOS.

20. The ferroelectric memory device of claim 10 wherein said passivation layer is substantially 7,000 Å in thickness.

* * * * *